United States Patent
Kondo

(10) Patent No.: US 10,349,562 B2
(45) Date of Patent: Jul. 9, 2019

(54) SEMICONDUCTOR POWER CONVERTER

(71) Applicant: Mitsubishi Electric Corporation, Tokyo (JP)

(72) Inventor: Nozomi Kondo, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 169 days.

(21) Appl. No.: 15/123,793

(22) PCT Filed: Feb. 23, 2015

(86) PCT No.: PCT/JP2015/054998
§ 371 (c)(1),
(2) Date: Sep. 6, 2016

(87) PCT Pub. No.: WO2016/135817
PCT Pub. Date: Sep. 1, 2016

(65) Prior Publication Data
US 2017/0020034 A1  Jan. 19, 2017

(51) Int. Cl.
*H05K 7/20* (2006.01)
*H05K 5/00* (2006.01)
*H02M 5/42* (2006.01)

(52) U.S. Cl.
CPC ....... *H05K 7/20945* (2013.01); *H05K 5/0017* (2013.01); *H05K 7/20909* (2013.01); *H02M 5/42* (2013.01)

(58) Field of Classification Search
None
See application file for complete search history.

(56) References Cited

U.S. PATENT DOCUMENTS

| 5,230,564 A * | 7/1993 | Bartilson ............... G01K 3/005 257/467 |
| 7,969,738 B2 * | 6/2011 | Koo ....................... F25B 21/02 136/211 |

(Continued)

FOREIGN PATENT DOCUMENTS

| JP | 10-56707 A | 2/1998 |
| JP | 11-354955 A | 12/1999 |

(Continued)

OTHER PUBLICATIONS

International Search Report of PCT/JP2015/054998 dated May 19, 2015.

*Primary Examiner* — Courtney L Smith
(74) *Attorney, Agent, or Firm* — Sughrue Mion, PLLC; Richard C. Turner

(57) ABSTRACT

A semiconductor power converter includes a main circuit board installed in a housing of the semiconductor power converter. On the main circuit board, a main circuit converting power supplied from a power source to supply converted power to a load, and a first temperature sensor are disposed. The converter also includes a control circuit board installed in the housing. On the control circuit board, a control circuit controlling the main circuit, and a second temperature sensor are disposed. The converter further includes an internal-air-temperature estimation circuit that estimates an internal air temperature in the semiconductor power converter by using a temperature detected by the first temperature sensor and a temperature detected by the second temperature sensor.

11 Claims, 3 Drawing Sheets

(56) References Cited

U.S. PATENT DOCUMENTS

| | | | | |
|---|---|---|---|---|
| 8,159,820 B2 * | 4/2012 | Ibori | ............... | H02M 7/003 |
| | | | | 174/252 |
| 8,159,823 B2 * | 4/2012 | Murakami | ............ | H01L 23/473 |
| | | | | 180/243 |
| 9,161,475 B2 * | 10/2015 | Ng | ............... | G06F 1/20 |
| 9,474,189 B2 * | 10/2016 | Kawauchi | ............ | H02M 7/003 |
| 9,701,335 B2 * | 7/2017 | Hagiwara | ............ | B62D 5/0406 |
| 2003/0072117 A1 * | 4/2003 | Maekawa | ............... | H02M 1/08 |
| | | | | 361/86 |
| 2003/0133319 A1 * | 7/2003 | Radosevich | ............ | B60L 11/12 |
| | | | | 363/141 |
| 2011/0249421 A1 * | 10/2011 | Matsuo | ............... | B60K 6/445 |
| | | | | 361/821 |
| 2012/0281433 A1 * | 11/2012 | Yamanaka | ............ | H02M 7/003 |
| | | | | 363/13 |
| 2013/0294040 A1 * | 11/2013 | Fukumasu | ............... | H02M 1/44 |
| | | | | 361/752 |
| 2014/0126154 A1 * | 5/2014 | Higuchi | ............... | B60L 11/1803 |
| | | | | 361/714 |

FOREIGN PATENT DOCUMENTS

| | | | |
|---|---|---|---|
| JP | 2002-095155 | A | 3/2002 |
| JP | 2003-324967 | A | 11/2003 |
| JP | 2008-161054 | A | 7/2008 |
| JP | 2010-199179 | A | 9/2010 |
| JP | 2012-223062 | A | 11/2012 |
| JP | 2014-132829 | A | 7/2014 |
| WO | 2012/059983 | A1 | 5/2012 |

\* cited by examiner

SEMICONDUCTOR POWER CONVERTER

CROSS REFERENCE TO RELATED APPLICATIONS

This application is a National Stage of International Application No. PCT/JP2015/054998 filed Feb. 23, 2015, the contents of which are incorporated herein by reference in their entirety.

FIELD

The present invention relates to a semiconductor power converter that converts power supplied from a power source and supplies the converted power to a load.

BACKGROUND

In recent years, various models of semiconductor power converters are offered to the market at relatively low costs and they are used by many users for various purposes. This increases the number of users who use semiconductor power converters in an environment in which the temperature is outside the temperature range indicated in the specification of the semiconductor power converter. Using the semiconductor power conductor in such an environment causes a decrease in lifetime and degradation of the characteristics of heat-generating components, such as semiconductor switching elements and capacitors of main circuits of the semiconductor power converters. To address these problems, a conventional technique disclosed in, e.g., Patent Literature 1 employs a structure designed to cool a heat-generating component by transferring heat generated with by loss in the heat-generating component to a radiation fin as well as cooling the heat-generating component by controlling a rotational speed of a cooling fan on the basis of a temperature value detected by a temperature sensor provided in the radiation fin.

CITATION LIST

Patent Literature

Patent Literature 1: Japanese Patent Application Laid-open No. 2014-132829

SUMMARY

Technical Problem

For the conventional technique described in Patent Literature 1, the heat-generating component and the temperature sensor, which are disposed in the semiconductor power converter, are thermally connected via the radiation fin to each other. Unfortunately, a part of heat generated in the heat-generating component is released into the semiconductor power converter without being transferred to the radiation fin. In such a configuration, as the distance from the heat-generating component to the temperature sensor is larger, the temperature detected by the temperature sensor tends to have a lower value than the internal air temperature in the semiconductor power converter. As a result, although the internal air temperature has reached a set temperature at which the cooling fan should commence its operation, the cooling fan fails to operate because the temperature detected by the temperature sensor is lower than the set temperature. This causes the electronic components to shorten the lives and degrade the characteristics. Consequently, the quality of the semiconductor power converter reduces. On the other hand, when a situation in which the radiation fin clogs and, thus, release of heat absorbed by the radiation fin is difficult continues, the temperature detected by the temperature sensor tends to have a higher value than the internal air temperature. Thus, although the internal air temperature has not reached the set temperature at which the cooling fan should commence its operation, the cooling fan operates because the temperature detected by the temperature sensor is higher than the set temperature. This shortens the life of the cooling fan as well as increasing the power consumption due to the driving of the cooling fan. Consequently, the quality of the semiconductor power converter reduces.

The present invention has been achieved in view of the above problems, and an object of the present invention is to provide a semiconductor power converter that can enhance its quality.

Solution to Problem

In one aspect of the present invention, there is provided a semiconductor power converter comprising: a main circuit board that is installed in a housing and on which a first temperature sensor and a main circuit that converts power supplied from a power source to supply the converted power to a load are disposed; a control circuit board that is installed in the housing and on which a second temperature sensor and a control circuit that controls the main circuit are disposed; and an internal-air-temperature estimation circuit that estimates an internal air temperature in the semiconductor power converter by using a temperature detected by the first temperature sensor and a temperature detected by the second temperature sensor.

Advantageous Effects of Invention

The semiconductor power converter according to the present invention can enhance its quality.

DESCRIPTION OF EMBODIMENT

An exemplary embodiment of a semiconductor power converter according to the present invention will be explained below in detail with reference to the accompanying drawings. The present invention is not limited to the embodiment.

Embodiment

Figure 1:
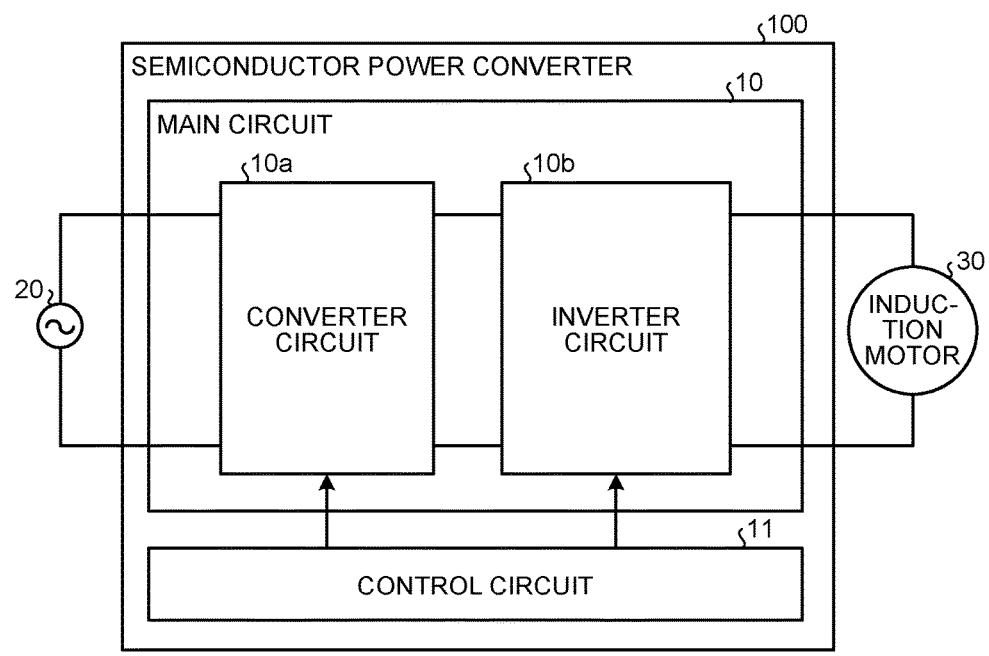
FIG. 1 is a functional block diagram of a semiconductor power converter according to an embodiment of the present invention.

FIG. 1 is a functional block diagram of a semiconductor power converter according to an embodiment of the present invention. A semiconductor power converter 100 includes: a main circuit 10 that converts AC power from an AC power source 20 into power having a predetermined frequency and a predetermined value and outputs the converted power to a load, i.e., an induction motor 30; and a control circuit 11 that outputs a control signal for operating semiconductor switching elements (not illustrated) of the main circuit 10. The main circuit 10 includes a converter circuit 10a that converts the AC power from the AC power source 20 into DC power by a switching operation of the switching elements controlled by the control circuit 11; and an inverter circuit 10b that converts the DC power from the converter circuit 10a into AC power by a switching operation of switching elements controlled by the control circuit 11 and outputs the AC power.

Figure 2:
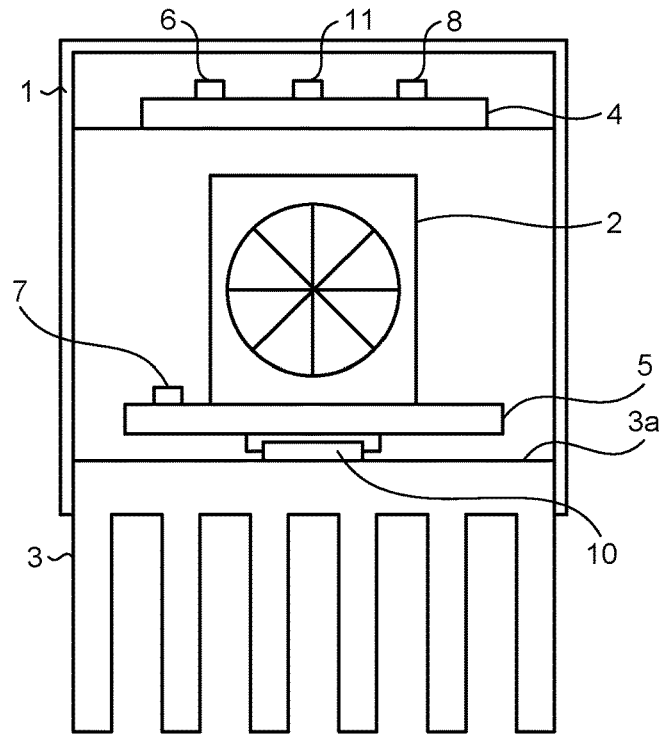
FIG. 2 is an interior view of the semiconductor power converter according to the embodiment of the present invention.

FIG. 2 is an interior view of the semiconductor power converter according to the embodiment of the present invention. The semiconductor power converter 100 includes: a rectangular housing 1; a main circuit board 5 that is installed in the housing 1 and on which a first temperature sensor 7 and the main circuit 10 are disposed; a flat-plate-shaped control circuit board 4 that is installed in the housing 1 and on which a second temperature sensor 6, an internal-air-temperature estimation circuit 8, and the control circuit 11 are disposed; a radiation fin 3 fixed to the housing 1 and thermally connected to the main circuit 10; and a cooling fan 2 that circulates air in the housing 1. In the semiconductor power converter 100 in the illustrated example, the control circuit board 4 is disposed in parallel with the top surface of the housing and the main circuit board 5 is disposed on a lower side of the housing. The radiation fin 3, which is fixed to the housing with a fastening member (not illustrated), has an interior side surface 3a thermally connected to the main circuit 10.

In the semiconductor power converter 100, the control circuit board 4 and the main circuit board 5 are enclosed by the housing 1 and the radiation fin 3, so that a part of heat generated in the main circuit 10 is absorbed by the radiation fin 3 and out from the semiconductor power converter while heat not absorbed by the radiation fin 3 is transferred to the main circuit board 5, air in the housing 1, and the housing 1. Accordingly, the internal air temperature in the housing 1 increases as the amount of heat generated in the main circuit 10 increases. The semiconductor power converter 100 according to the present embodiment estimates the internal air temperature by using the temperature detected by the first temperature sensor 7 and the temperature detected by the second temperature sensor 6, and uses the estimated internal air temperature to perform various controls. A method for estimating the internal air temperature and the details of the various controls performed using the estimated internal air temperature are described below.

Figure 3:
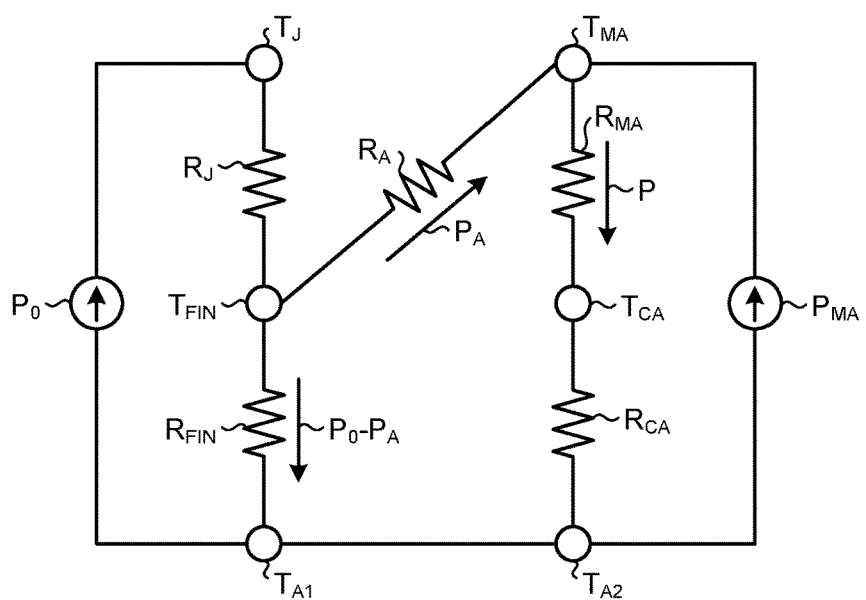
FIG. 3 is a diagram schematically illustrating a thermal circuit model of the semiconductor power converter according to the embodiment of the present invention.

First, the method for estimating the internal air temperature is described with reference to FIG. 3. FIG. 3 is a diagram schematically illustrating a thermal circuit model of the semiconductor power converter according to the embodiment of the present invention. $P_O$ illustrated in the left side of FIG. 3 denotes heat corresponding to power loss occurring in the main circuit, $T_J$ denotes a junction temperature of the switching element, $R_J$ denotes a thermal resistance between the main circuit and the radiation fin 3, $T_{FIN}$ denotes a temperature of heat transferred to the radiation fin 3, and $R_{FIN}$ denotes a thermal resistance of the radiation fin 3, that is, a thermal resistance on a path from the part where the main circuit and the radiation fin 3 contact each other to the surface of the radiation fin 3. $T_{A1}$ denotes a temperature of heat released from the surface of the radiation fin 3 to the outside of the semiconductor power converter, and such heat is part of heat transferred to the radiation fin 3.

$R_A$ illustrated in the center of FIG. 3 denotes a thermal resistance between the radiation fin 3 and the main circuit board 5. $P_A$ denotes heat transferred to the main circuit board 5 and is equal to heat obtained by subtracting heat released by the radiation fin 3 to the outside of the semiconductor power converter, from heat generated in the main circuit 10.

$P_{MA}$ illustrated in the right side of FIG. 3 denotes heat generated from the main circuit board 5. The housing 1 and the interior air of the housing 1 can be transfer paths of $P_{MA}$ and the path is largely the housing 1. The value of $P_{MA}$ varies depending not only upon the material, shape, and size of the housing 1 but also upon the rotation of the cooling fan 2. $T_{MA}$ denotes a temperature of heat measured on the main circuit board 5 and is equal to the temperature of heat obtained by subtracting heat released by the radiation fin to the outside of the semiconductor power converter, from heat generated in the main circuit. $T_{MA}$ corresponds to a temperature detected by the first temperature sensor 7 illustrated in FIG. 2. $R_{MA}$ denotes a thermal resistance on a path from the main circuit board 5 to the control circuit board 4 and has a value determined by the shape of the housing and a flow of air in the housing. P denotes heat transferred to the control circuit board 4. $T_{CA}$ denotes a temperature of heat measured on the control circuit board 4 and corresponds to a temperature detected by the second temperature sensor 6 illustrated in FIG. 2. $R_{CA}$ denotes a thermal resistance between the control circuit board 4 and air, and $T_{A2}$ denotes a temperature of heat released into the semiconductor power converter, and such heat is part of heat transferred from the main circuit board 5 to the control circuit board 4.

According to the thermal circuit model illustrated in FIG. 3, $T_{MA}$ can be calculated from $R_{MA}$, P, and $T_{CA}$ by using a thermal equation represented by expression (1) below.

$$T_{MA} = R_{MA} \cdot P + T_{CA} \quad (1)$$

$T_{CA}$ can be calculated from $R_{CA}$, P, and $T_{A2}$ by using a thermal equation represented by expression (2) below.

$$T_{CA} = R_{CA} \cdot P + T_{A2} \quad (2)$$

On the basis of expressions (1) and (2), $T_{A2}$ is represented by the following expression (3) using $T_{CA}$, $T_{MA}$, $R_{CA}$, and $R_{MA}$.

$$T_{A2} = T_{CA} - (R_{CA}/R_{MA}) \cdot (T_{MA} - T_{CA}) \quad (3)$$

A value obtained by dividing $R_{CA}$ by $R_{MA}$ is hereinafter referred to as a "thermal resistance coefficient α". The internal air temperature can be estimated by presenting the values of the thermal resistance coefficient α in the form of a table and obtaining the variables $T_{CA}$ and $T_{MA}$. The semiconductor power converter 100 according to the present embodiment estimates the internal air temperature from the temperature $T_{MA}$ detected by the first temperature sensor 7 and the temperature $T_{CA}$ detected by the second temperature sensor 6.

Figure 4:
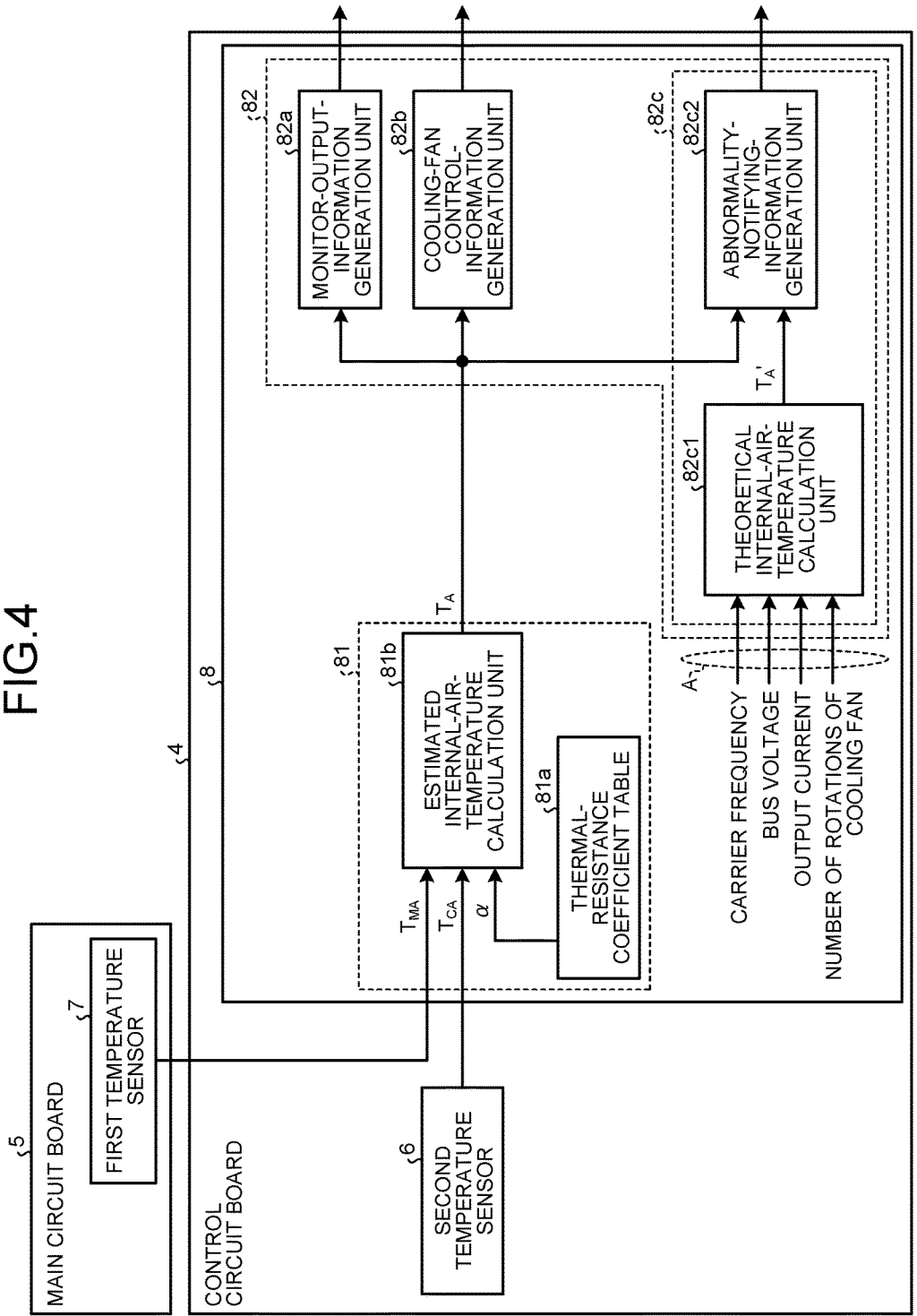
FIG. 4 is a diagram illustrating, primarily, a function of an internal-air-temperature estimation circuit disposed on a control circuit board according to the embodiment of the present invention.

Next, a description will be given, with reference to FIG. 4, of a function of estimating the internal air temperature and performing various controls by using the estimated internal air temperature. FIG. 4 is a diagram illustrating, primarily, a function of the internal-air-temperature estimation circuit disposed on the control circuit board according to the embodiment of the present invention, and, in particular, the first temperature sensor 7 disposed on the main circuit board 5, the second temperature sensor 6 disposed on the control circuit board 4, and the internal-air-temperature estimation circuit 8 disposed on the control circuit board 4. The internal-air-temperature estimation circuit 8 includes an internal-air-temperature estimation unit 81 and a control-information generation unit 82, and receives inputs that are the temperature detected by the first temperature sensor 7 and the temperature detected by the second temperature sensor 6 and outputs any of monitor output information, control information on the cooling fan, and abnormality notifying information.

The internal-air-temperature estimation unit 81 has a thermal-resistance coefficient table 81a in which plural sizes of the housing and plural thermal resistance coefficients α are stored in association with each other, and an estimated internal-air-temperature calculation unit 81b that calculates an estimated internal air temperature $T_A$ in the semiconductor power converter by using the temperature $T_{MA}$ detected by the first temperature sensor 7, the temperature $T_{CA}$ detected by the second temperature sensor 6, and the thermal resistance coefficient α stored in the thermal-resistance coefficient table 81a.

The information generation unit 82 includes: a monitor-output-information generation unit 82a that generates and outputs monitor output information corresponding to the value of the estimated internal air temperature $T_A$; a cooling-fan control-information generation unit 82b that generates and outputs control information for switching on or off the cooling fan 2 or controlling the number of rotations of the cooling fan 2 that corresponds to the value of the estimated internal air temperature $T_A$; and an abnormality notification unit 82c.

The abnormality notification unit 82c includes: a theoretical internal-air-temperature calculation unit 82c1 that calculates a theoretical internal air temperature $T_{A'}$ on the basis of operation state information A on the semiconductor power converter; and an abnormality-notifying-information generation unit 82c2 that compares the estimated internal air temperature $T_A$ estimated by the internal-air-temperature estimation unit 81 with the theoretical internal air temperature $T_{A'}$ calculated by the theoretical internal-air-temperature calculation unit 82c1 and, when the estimated internal air temperature $T_A$ exceeds the theoretical internal air temperature $T_{A'}$, generates and outputs abnormality notifying information indicating that an abnormality occurs in the semiconductor power converter. The operation state information A input to the theoretical internal-air-temperature calculation unit 82c1 is, for example, a carrier frequency, a bus voltage of the main circuit 10, an output current of the main circuit 10, or the number of rotations of the cooling fan. An internal-air temperature table for each kind of the operation state information A is set in advance in the theoretical internal-air-temperature calculation unit 82c1. The internal-air temperature tables are, for example, a table in which plural values of the carrier frequencies and plural internal air temperatures are stored in association with each other, a table in which plural values of the bus voltages and plural internal air temperatures are stored in association with each other, a table in which plural values of the output currents and plural internal air temperatures are stored in association with each other, and a table in which plural numbers of rotations of the cooling fan and plural internal air temperatures are stored in association with each other. The operation state information A is not limited to the illustrated examples and can be information correlated to the internal air temperature, such as the number of rotations of the induction motor 30 illustrated in FIG. 1 or an input current of the main circuit 10.

The operation is described below. The estimated internal-air-temperature calculation unit 81b calculates the estimated internal air temperature $T_A$ in the semiconductor power converter by using the temperature $T_{MA}$ detected by the first temperature sensor 7, the temperature $T_{CA}$ detected by the second temperature sensor 6, and the thermal resistance coefficient α stored in the thermal-resistance coefficient table 81a.

The monitor-output-information generation unit 82a generates monitor output information corresponding to the value of the estimated internal air temperature $T_A$ and outputs the generated monitor output information to a display device (not illustrated). As a result, the value of the estimated internal air temperature $T_A$ is displayed on the display device and the user can know the state of the semiconductor power converter via the display device.

The cooling-fan control-information generation unit 82b generates control information corresponding to the value of the estimated internal air temperature $T_A$ and outputs the generated control information to the cooling fan 2. In the conventional technique described above, although the internal air temperature has reached a set temperature at which the operation of the cooling fan should commence, the cooling fan fails to operate because the temperature detected by the temperature sensor provided in the radiation fin is lower than the set temperature. The cooling-fan control-information generation unit 82b according to the present embodiment enables the appropriate operation of the cooling fan, and suppresses the shortening of the lives of the electronic components and the degradation of the characteristics of the electronic components. In the conventional technique described above, additionally, although the internal air temperature has not reached the set temperature at which the operation of the cooling fan should commence, the cooling fan operates because the temperature detected by the temperature sensor provided in the radiation fin is higher than the set temperature. The cooling-fan control-information generation unit 82b according to the present embodiment prevents an unwanted operation of the cooling fan and suppresses the increase in power consumption due to the driving of the cooling fan, and the shortening of the life of the cooling fan.

The abnormality notification unit 82c generates the abnormality notifying information in a possible situation where the radiation fin clogs and thus heat absorbed by the radiation fin is difficult. The abnormality notifying information output from the abnormality notification unit 82c is output, for example, to the control circuit 11 illustrated in FIG. 1 and the control circuit 11 that has received the abnormality notifying information generates a control signal for stopping or suppressing power to be supplied to the induction motor 30. This prevents failure of the electronic components of the semiconductor power converter 100, and suppresses the shortening of the lives of the electronic components and the degradation of characteristics of the electronic components. The abnormality notifying information generated by the abnormality notification unit 82c is output to a display device (not illustrated). This configuration enables the user to know the abnormality of the semiconductor power converter.

While the internal-air-temperature estimation circuit 8 illustrated in FIGS. 2 and 4 is disposed on the control circuit board 4, the place to position the internal-air-temperature estimation circuit 8 is not limited to the illustrated example. The internal-air-temperature estimation circuit 8 may be disposed at a position other than the control circuit board 4, for example, on the main circuit board 5. The internal-air-temperature estimation unit 81 and the information generation unit 82 as the functions of the internal-air-temperature estimation circuit 8 illustrated in FIG. 4 may be incorporated, for example, in the control circuit 11. The configuration of the information generation unit 82 illustrated in FIG. 4 is not limited to the illustrated example, and may be a configuration including any one of the monitor-output-information generation unit 82a, the cooling-fan control-information generation unit 82b, and the malfunction notification unit 82c. Furthermore, the first temperature sensor 7 and the second temperature sensor 6 illustrated in FIG. 2, which are temperature measurement units such as a thermistor, a resistance thermometer, or a thermocouple, are not limited to particular kinds of sensors.

The configuration of the semiconductor power converter 100 illustrated in FIG. 2 is not limited to the illustrated example. For example, the positions of the control circuit board 4 and the main circuit board 5 are not limited to those in the illustrated example. The control circuit board 4 or the main circuit board 5 may be disposed in parallel with the lateral side surface of the housing or the control circuit board 4 and the main circuit board 5 may be disposed adjacent to each other on the lower side of the housing because this arrangement of the boards 4 and 5 enables the estimation of the internal air temperature. However, as the control circuit board 4 and the main circuit board 5 are closer to each other, the temperature difference between the temperature $T_{MA}$ detected by the first temperature sensor 7 and the temperature $T_{CA}$ detected by the second temperature sensor 6 illustrated in FIG. 3 is smaller, which reduces the calculation accuracy of the estimated internal air temperature. Accordingly, it is preferable that the control circuit board 4 and the main circuit board 5 be spaced apart. For example, the control circuit board 4 is disposed on the upper side of the top surface of the housing 1 and the main circuit board 5 is disposed on the lower side of the housing 1, as illustrated in FIG. 2. Alternatively, the control circuit board 4 is disposed on one of the opposite lateral side surfaces of the housing 1 and the main circuit board 5 is disposed on the other lateral side surface of the housing 1.

The radiation fin 3, which is thermally connected to the main circuit 10, may be disposed at any position not limited to that in the illustrated example. While the radiation fin 3 and the cooling fan 2 are used in the semiconductor power converter 100 illustrated in FIG. 2, the main circuit 10 may be connected to the housing 1 to enable the housing 1 to release heat of the main circuit 10, in which case either one or both of the radiation fin 3 and the cooling fan 2 can be omitted. The semiconductor power converter 100 illustrated in FIG. 1 is not limited to the illustrated example and can be a power converter that converts DC power from a DC power source into AC power having a predetermined frequency and a predetermined value and outputs the AC power to a load, or a power converter that converts DC power from a DC power source into DC power having a predetermined value and outputs the converted DC power to a load. A load of the semiconductor power converter 100 is not limited to the induction motor 30.

As described above, the semiconductor power converter 100 according to the present embodiment includes: the main circuit board that is installed in the housing of the semiconductor power converter and on which the first temperature sensor and the main circuit that converts the power supplied from the power source to supply the converted power to the load are disposed; the control circuit board that is installed in the housing and on which the second temperature sensor and the control circuit that controls the main circuit are disposed; and the internal-air-temperature estimation circuit that estimates the internal air temperature in the semiconductor power converter by using the temperature detected by the first temperature sensor and the temperature detected by the second temperature sensor. This configuration enables the accurate estimation of the internal air temperature in the semiconductor power converter 100 and the various controls using the estimated internal air temperature, and thus improves the quality of the semiconductor power converter 100.

The configuration described in the above embodiment is only an example of the content of the present invention, and the configuration can be combined with other publicly known techniques, and a part of the configuration can be omitted or modified without departing from the scope of the present invention.

REFERENCE SIGNS LIST

1 housing, 2 cooling fan, 3 radiation fin, 3a interior side surface, 4 control circuit board, 5 main circuit board, 6 second temperature sensor, 7 first temperature sensor, 8 internal-air-temperature estimation circuit, 10 main circuit, 10a converter circuit, 10b inverter circuit, 11 control circuit, 20 AC power source, induction motor, 81 internal-air-temperature estimation unit, 81a thermal-resistance coefficient table, 81b estimated internal-air-temperature calculation unit, information generation unit, 82a monitor-output-information generation unit, 82b cooling-fan control-information generation unit, 82c abnormality notification unit, 82c1 theoretical internal-air-temperature calculation unit, 82c2 abnormality-notifying-information generation unit, 100 semiconductor power converter.

The invention claimed is:

1. A semiconductor power converter comprising:
   a main circuit board that is installed in a housing and on which a first temperature sensor and a main circuit that converts power supplied from a power source to supply the converted power to a load are disposed;
   a control circuit board that is installed apart from the main circuit board in the housing, and on which a second temperature sensor and a control circuit that controls the main circuit are disposed, the second temperature sensor and the first temperature sensor being different sensors;
   an internal-air-temperature estimation circuit that estimates an internal air temperature in the semiconductor power converter by using a temperature detected by the first temperature sensor and a temperature detected by the second temperature sensor, and provides at least one piece of information generated based on the estimated internal air temperature; and
   a cooling fan installed in the housing,
   wherein the internal-air-temperature estimation circuit includes a cooling-fan control-information generation unit that generates control information on the cooling fan, the control information corresponding to a value of the estimated internal air temperature.

2. A semiconductor power converter comprising:
   a main circuit board that is installed in a housing and on which a first temperature sensor and a main circuit that converts power supplied from a power source to supply the converted power to a load are disposed;
   a control circuit board that is installed apart from the main circuit board in the housing, and on which a second temperature sensor and a control circuit that controls the main circuit are disposed, the second temperature sensor and the first temperature sensor being different sensors; and an internal-air-temperature estimation circuit that estimates an internal air temperature in the semiconductor power converter by using a temperature detected by the first temperature sensor and a temperature detected by the second temperature sensor, and provides at least one piece of information generated based on the estimated internal air temperature, wherein the internal-air-temperature estimation circuit includes a theoretical internal-air-temperature calculation unit that calculates a theoretical internal air temperature on a basis of operation state information on the semiconductor power converter, and an abnormality-notifying-information generation unit that compares the estimated internal air temperature with the theoretical internal air temperature and, when the estimated internal air temperature exceeds the theoretical internal air temperature, generates abnormality notifying information indicating that an abnormality occurs in the semiconductor power converter.

3. The semiconductor power converter according to claim 2, wherein the abnormality notifying information generated by the abnormality-notifying-information generation unit is output to a display device.

4. The semiconductor power converter according to claim 1, wherein the internal-air-temperature estimation circuit receives inputs that are the temperature detected by the first temperature sensor and the temperature detected by the second temperature sensor and outputs the control information for controlling the cooling fan.

5. The semiconductor power converter according to claim 2, wherein the internal-air-temperature estimation circuit receives inputs that are the temperature detected by the first temperature sensor and the temperature detected by the second temperature sensor and outputs the abnormality notifying information.

6. The semiconductor power converter according to claim 1, wherein the internal-air-temperature estimation circuit includes a monitor-output-information generation unit that generates monitor output information corresponding to a value of the estimated internal air temperature.

7. The semiconductor power converter according to claim 6, wherein the internal-air-temperature estimation circuit receives inputs that are the temperature detected by the first temperature sensor and the temperature detected by the second temperature sensor and outputs the monitor output information.

8. The semiconductor power converter according to claim 1, wherein the main circuit board and the control circuit board are disposed to face a top surface and a bottom surface of the housing, respectively, or are disposed to face each of opposite lateral side surfaces of the housing, respectively.

9. The semiconductor power converter according to claim 2, wherein the internal-air-temperature estimation circuit includes a monitor-output-information generation unit that generates monitor output information corresponding to a value of the estimated internal air temperature.

10. The semiconductor power converter according to claim 9, wherein the internal-air-temperature estimation circuit receives inputs that are the temperature detected by the first temperature sensor and the temperature detected by the second temperature sensor and outputs the monitor output information.

11. The semiconductor power converter according to claim 2, wherein the main circuit board and the control circuit board are disposed to face a top surface and a bottom surface of the housing, respectively, or are disposed to face each of opposite lateral side surfaces of the housing, respectively.

* * * * *